(12) United States Patent
Janta-Polczynski

(10) Patent No.: US 12,326,592 B2
(45) Date of Patent: Jun. 10, 2025

(54) HETEROGENEOUS PACKAGE STRUCTURES WITH PHOTONIC DEVICES

(71) Applicant: International Business Machines Corporation, Armonk, NY (US)

(72) Inventor: Barnim Alexander Janta-Polczynski, Shefford (CA)

(73) Assignee: International Business Machines Corporation, Armonk, NY (US)

( * ) Notice: Subject to any disclaimer, the term of this patent is extended or adjusted under 35 U.S.C. 154(b) by 213 days.

(21) Appl. No.: 18/076,733

(22) Filed: Dec. 7, 2022

(65) Prior Publication Data

US 2024/0192439 A1 Jun. 13, 2024

(51) Int. Cl.
| | | |
|---|---|---|
| G02B 6/42 | (2006.01) | |
| G02B 6/12 | (2006.01) | |
| H01L 21/56 | (2006.01) | |
| H01L 25/00 | (2006.01) | |
| H01L 25/16 | (2023.01) | |

(Continued)

(52) U.S. Cl.
CPC .......... G02B 6/12004 (2013.01); G02B 6/42 (2013.01); H01L 21/561 (2013.01); H01L 25/167 (2013.01); H01L 25/18 (2013.01); H01L 25/50 (2013.01); H01L 23/538 (2013.01); H01L 24/05 (2013.01); H01L 24/16 (2013.01);

(Continued)

(58) Field of Classification Search
CPC .................................. G02B 6/42; G02B 6/43
See application file for complete search history.

(56) References Cited

U.S. PATENT DOCUMENTS 6,343,171 B1 * 1/2002 Yoshimura .......... H01L 23/5389
385/24
7,480,429 B1 1/2009 Chiniwalla et al.
(Continued)

FOREIGN PATENT DOCUMENTS

CN 220306704 U * 1/2024
JP 6052815 B2 12/2016
(Continued)

OTHER PUBLICATIONS

K. Nieweglowski et al., "Optical Coupling with Flexible Polymer Waveguides for Chip-to-Chip Interconnects in Electronic Systems," Microelectronics Reliability, May 2018, pp. 121-126, vol. 84.
(Continued)

*Primary Examiner* — Michael Stahl
(74) *Attorney, Agent, or Firm* — L Jeffrey Kelly; Ryan, Mason & Lewis, LLP

(57) ABSTRACT

Heterogeneous package structures comprising photonic components are provided. For example, an exemplary package structure comprises at least one electronic device, at least one photonic device, at least one bridge interconnect device, and at least one optical waveguide device. The at least one bridge interconnect device is configured to electrically connect the at least one electronic device to the at least one photonic device. The at least one optical waveguide device is optically coupled to the at least one photonic device to implement an optical bus for routing optical signals in the package structure. The at least one photonic device is configured to implement an electro-optical interface between the at least one electronic device and the optical bus.

20 Claims, 7 Drawing Sheets

(51) Int. Cl.
*H01L 25/18* (2023.01)
*H01L 23/00* (2006.01)
*H01L 23/538* (2006.01)

(52) U.S. Cl.
CPC ............... *H01L 2224/0557* (2013.01); *H01L 2224/16227* (2013.01)

(56) References Cited

U.S. PATENT DOCUMENTS

| | | |
|---|---|---|
| 8,766,284 B1 | 7/2014 | Dutta |
| 9,389,362 B1 | 7/2016 | Brunschwiler et al. |
| 9,563,030 B2 | 2/2017 | Barwicz et al. |
| 9,857,539 B2 | 1/2018 | Barwicz et al. |
| 10,416,393 B2 | 9/2019 | Barwicz et al. |
| 10,598,860 B2 | 3/2020 | Ramachandran et al. |
| 10,641,953 B1 | 5/2020 | Vashishtha et al. |
| 10,989,887 B2 | 4/2021 | Lim et al. |
| 2012/0224804 A1* | 9/2012 | Hashimoto ............... G02B 6/43 438/27 |
| 2013/0230274 A1* | 9/2013 | Fish ....................... G02B 6/305 385/14 |
| 2013/0308898 A1 | 11/2013 | Doerr et al. |
| 2014/0092576 A1* | 4/2014 | Lucero ............... G02B 6/12004 438/65 |
| 2014/0203175 A1* | 7/2014 | Kobrinsky ........... G02B 6/4214 250/214.1 |
| 2016/0238786 A1 | 8/2016 | Garner et al. |
| 2016/0327742 A1 | 11/2016 | Collins et al. |
| 2017/0254968 A1* | 9/2017 | Ding ....................... H01L 24/20 |
| 2019/0162901 A1* | 5/2019 | Yu ......................... H05K 1/112 |
| 2020/0003950 A1* | 1/2020 | Yu ......................... G02B 6/124 |
| 2020/0006088 A1* | 1/2020 | Yu ............................. G02B 6/30 |
| 2020/0057218 A1 | 2/2020 | Islam et al. |
| 2020/0091124 A1* | 3/2020 | Liao ..................... G02B 6/4201 |
| 2020/0271873 A1* | 8/2020 | Chang .................. G02B 6/4253 |
| 2020/0310052 A1 | 10/2020 | Lim et al. |
| 2021/0109302 A1* | 4/2021 | Lim ..................... G02B 6/3636 |
| 2022/0105695 A1 | 4/2022 | Jiang et al. |
| 2022/0155526 A1* | 5/2022 | Dong ................... G02B 6/4274 |
| 2022/0158736 A1* | 5/2022 | Testa .................... G02B 6/4245 |
| 2022/0342150 A1* | 10/2022 | Karhade ............... G02B 6/4274 |
| 2023/0080454 A1* | 3/2023 | Pietambaram ........ G02B 6/4274 385/14 |
| 2023/0185033 A1* | 6/2023 | Darmawikarta ..... G02B 6/4232 385/14 |
| 2023/0204879 A1* | 6/2023 | Kim ..................... G02B 6/4214 385/33 |
| 2023/0221511 A1* | 7/2023 | Tang ...................... G02B 6/125 385/14 |
| 2024/0272389 A1* | 8/2024 | Shao .................... G02B 6/4243 |

FOREIGN PATENT DOCUMENTS

| | | |
|---|---|---|
| KR | 20160075599 A | 6/2016 |
| WO | 2020084306 A1 | 4/2020 |
| WO | 2020173561 A1 | 9/2020 |
| WO | 2020243692 A1 | 12/2020 |

OTHER PUBLICATIONS

E. Berikaa et al., "Net 67 Gbps Transmission over 2 km at Sub 1 Vpp Using Packaged Silicon Photonic MZM," IEEE Photonics Technology Letters, Nov. 2022, pp. 1139-1142, vol. 24, No. 21.

* cited by examiner

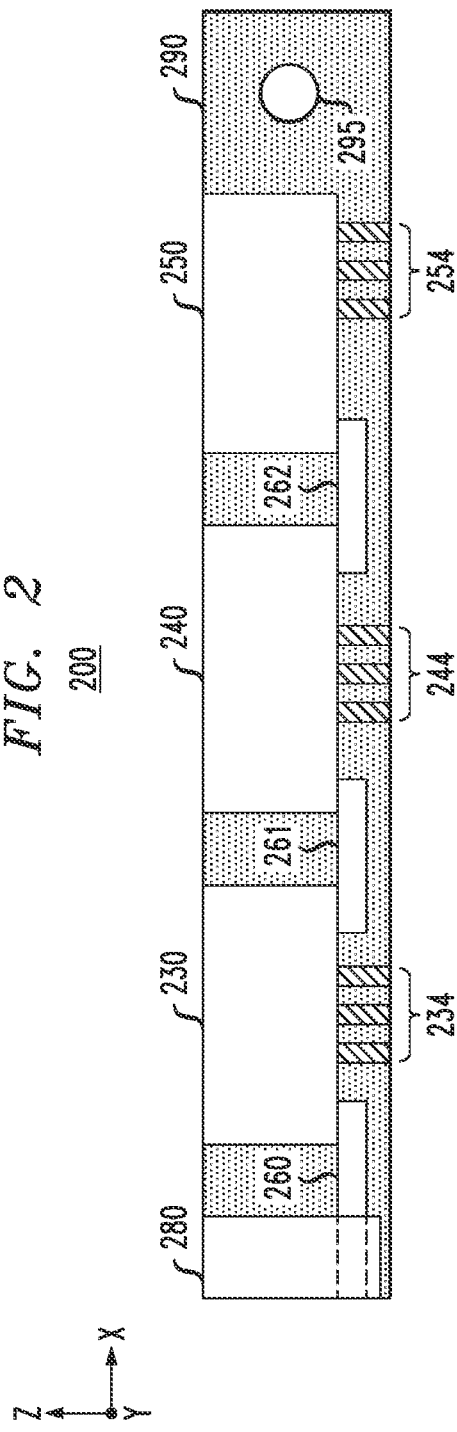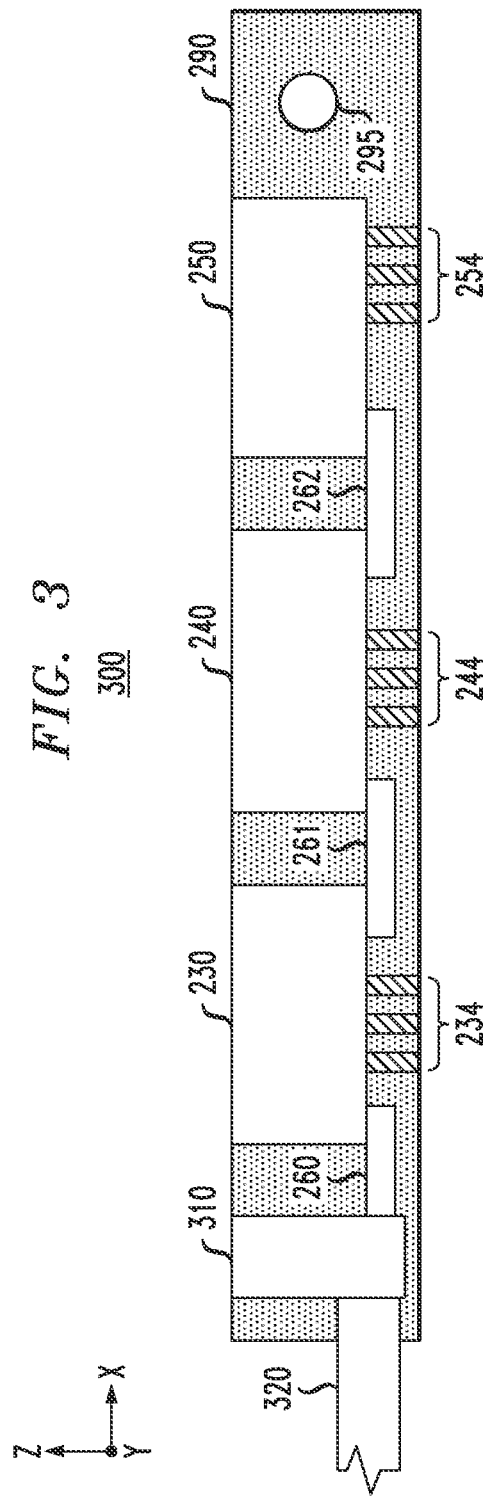

700

700

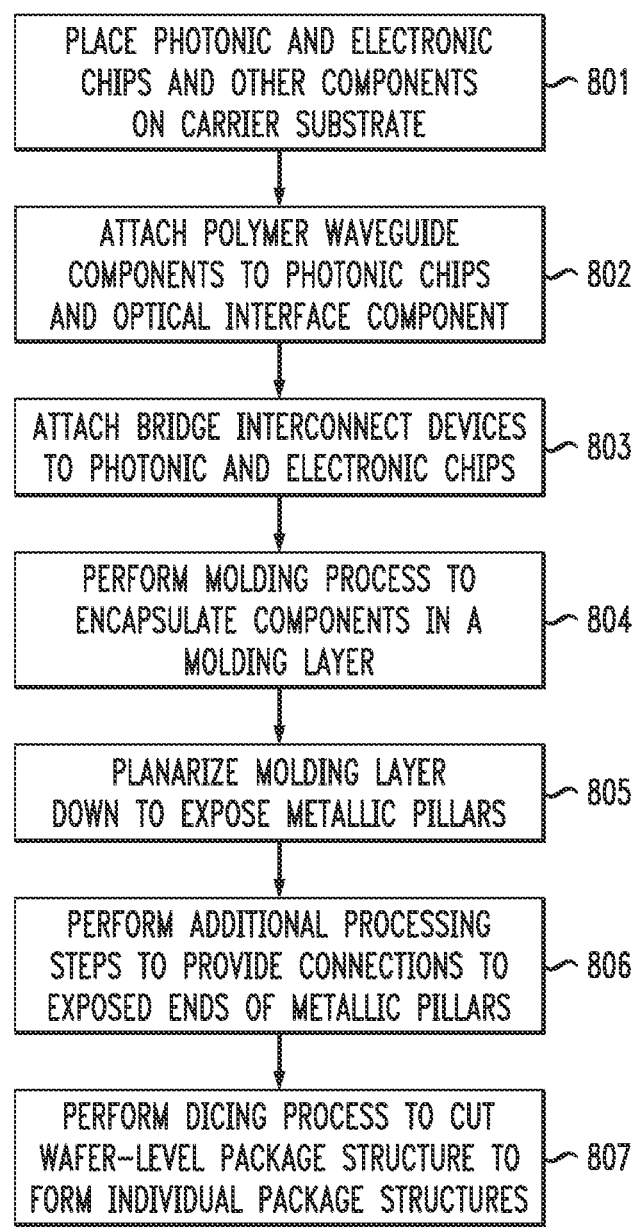

HETEROGENEOUS PACKAGE STRUCTURES WITH PHOTONIC DEVICES

BACKGROUND

This disclosure relates generally to heterogeneous chip package structures and, in particular, to package structures and techniques for heterogeneous integration of photonic chips and electronic chips. In general, photonic applications implement various functions with regard to light including, for example, generating, emitting, transmitting, modulating, signal processing, amplifying, and/or detecting/sensing light within the visible and near-infrared portions of the electromagnetic spectrum. Various techniques have been developed for implementing photonic applications. For example, some conventional techniques involve co-fabricating optoelectronic devices with complementary metal-oxide semiconductor (CMOS) integrated circuitry to implement photonic systems. However, achieving dense integration of optical components and electronic components in the same chip is not trivial due to, e.g., fabrication limits. On the other hand, chip-scale integration of photonics and electronics with die partitioning and heterogenous integration can be utilized to implement photonic applications.

SUMMARY

Exemplary embodiments of the disclosure include heterogeneous package structures comprising photonic devices. An exemplary embodiment includes a package structure which comprises at least one electronic device, at least one photonic device, at least one bridge interconnect device, and at least one optical waveguide device. The at least one bridge interconnect device is configured to electrically connect the at least one electronic device to the at least one photonic device. The at least one optical waveguide device is optically coupled to the at least one photonic device to implement an optical bus for routing optical signals in the package structure. The at least one photonic device is configured to implement an electro-optical interface between the at least one electronic device and the optical bus.

Another exemplary embodiment includes a package structure which comprises at least one application specific integrated circuit device, at least one photonic device, at least one bridge interconnect device, at least one optical waveguide device, and an optical connection device. The at least one photonic device implements an optical transceiver system. The at least one bridge interconnect device is configured to electrically connect the at least one application specific integrated circuit device to the at least one photonic device. The at least one optical waveguide device is optically coupled to the at least one photonic device to implement an optical bus for routing optical signals in the package structure. The optical connection device is optically coupled to the at least one optical waveguide device. The optical connection device is configured for connection to external optical fibers which transmit and receive optical signals to and from the optical transceiver system over the optical bus.

Another exemplary embodiment includes a package structure which comprises a plurality of package levels disposed in a vertically stacked configuration. At least one package level comprises at least one electronic device, at least one photonic device, at least one bridge interconnect device configured to electrically connect the at least one electronic device to the at least one photonic device, and at least one optical waveguide device that is optically coupled to the at least one photonic device to implement an optical bus for routing optical signals in the package structure. The at least one photonic device is configured to implement an electro-optical interface between the at least one electronic device and the optical bus.

Other embodiments will be described in the following detailed description of exemplary embodiments, which is to be read in conjunction with the accompanying figures.

BRIEF DESCRIPTION OF THE DRAWINGS

FIG. 2 is a schematic cross-sectional side view of a heterogeneous package structure with photonic components, according to another exemplary embodiment of the disclosure.

FIG. 3 is a schematic cross-sectional side view of a heterogeneous package structure with photonic components, according to another exemplary embodiment of the disclosure.

FIG. 8 illustrates a flow diagram of a process for fabricating a heterogeneous package structure with photonic components, according to an exemplary embodiment of the disclosure.

DETAILED DESCRIPTION

Figure 1:
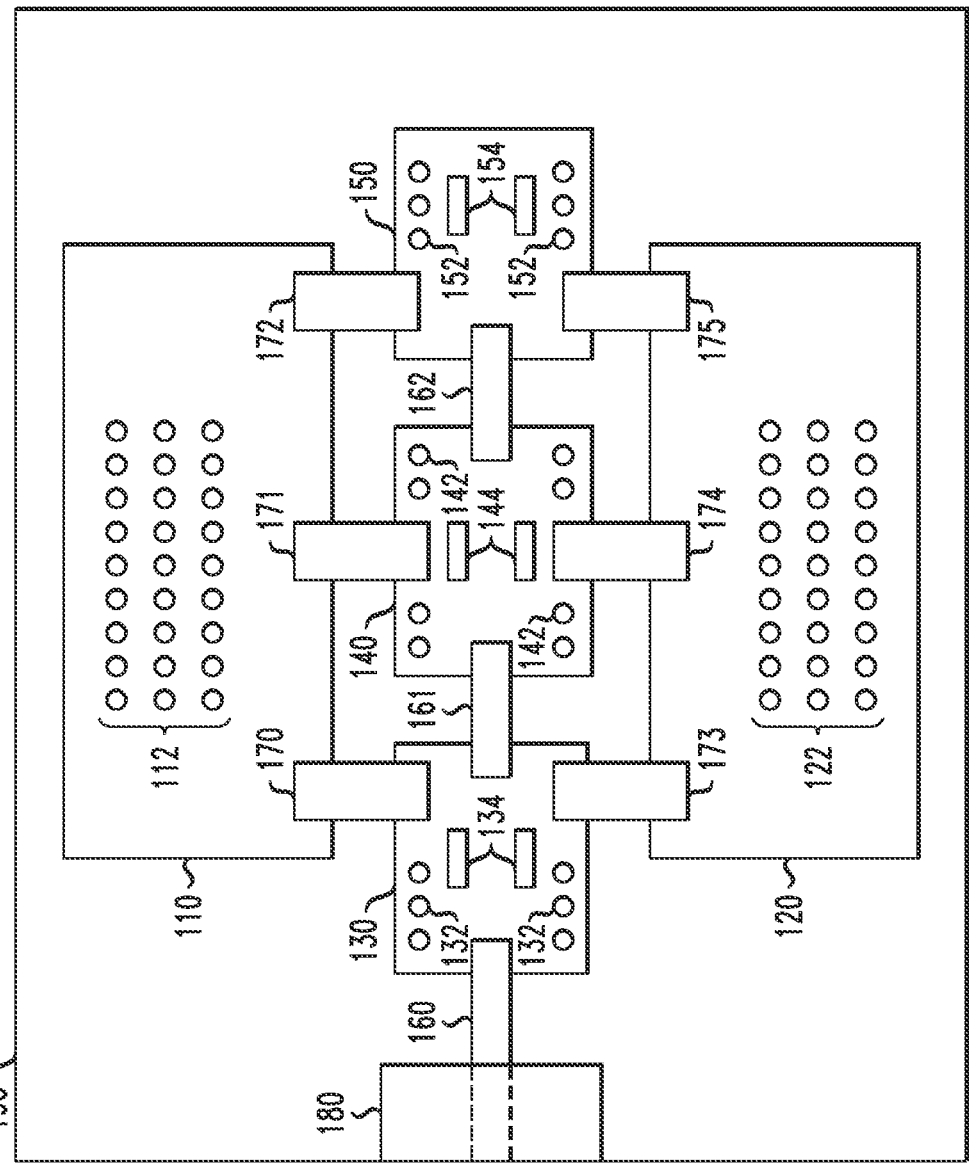
FIG. 1 is a schematic plan view of a heterogeneous package structure with photonic components, according to an exemplary embodiment of the disclosure.

Exemplary embodiments of the disclosure will now be described in further detail with regard to heterogeneous package structures with photonic components and, in particular, heterogeneous flip-chip package structures comprising electronic integrated circuit chips, photonic integrated circuit chips, and integrated optical buses that are implemented using optical waveguide structures (e.g., flexible polymer waveguide ribbon structures). It is to be understood that the various layers, structures, and regions shown in the accompanying drawings are schematic illustrations that are not drawn to scale. In addition, for ease of explanation, one or more layers, structures, and regions of a type commonly used to form package structures, semiconductor devices or structures, or photonic components may not be explicitly shown in a given drawing. This does not imply that any layers, structures, and regions not explicitly shown are omitted from the actual device, structures, and components. Furthermore, it is to be understood that the exemplary embodiments discussed herein are not limited to the particular materials, features, and processing steps shown and described herein.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount. The term "exemplary" as used herein means "serving as an example, instance, or illustration". Any embodiment or design described herein as "exemplary" is not to be construed as preferred or advantageous over other embodiments or designs. The word "over" as used herein to describe forming a feature (e.g., a layer) "over" a side or surface, means that the feature (e.g., the layer) may be formed "directly on" (i.e., in direct contact with) the implied side or surface, or that the feature (e.g., the layer) may be formed "indirectly on" the implied side or surface with one or more additional layers disposed between the feature (e.g., the layer) and the implied side or surface.

Further, the terms "electronic integrated circuit chip" or "electronic chip" or "electronic die" as used herein refer to a semiconductor die which comprises an integrated circuit, wherein the semiconductor die is fabricated on a semiconductor wafer comprising multiple dies which can be diced (cut) from the semiconductor wafer using a die singulation process to provide singulated dies for packaging. In the context of semiconductor electronic integrated circuits, a die is a block of semiconductor material on which a given functional circuit comprising active and passive electronic components is fabricated (e.g., memory, processor, etc.). In addition, the terms photonic integrated circuit (PIC) chip" or "photonic chip" or "photonic die" as used herein refer to a semiconductor die which comprises photonic components that operate with light (photons), wherein the photonic components include passive photonic components such as optical waveguide structures and active photonic components such as laser diodes, photodiodes, polarizers, phase shifters, etc. The terms "chip" and "die" are used interchangeably herein. In addition, the term "electronic device" in illustrative embodiments comprises an electronic chip or electronic die, and the term "photonic device" in illustrative embodiments comprises a photonic chip or photonic die.

Further, it is to be understood that the phrase "configured to" as used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise superconducting circuit elements, discrete circuit elements (e.g., transistors, inverters, etc.), programmable elements (e.g., application specific integrated circuit (ASIC) chips, field-programmable gate array (FPGA) chips, etc.), processing devices (e.g., central processing units (CPUs), graphics processing units (GPUs), etc.), one or more integrated circuits, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, and/or integrated circuits that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

To provide spatial context to the different structural orientations of the semiconductor structures shown in the drawings, XYZ Cartesian coordinates are shown in the drawings. The terms "vertical" or "vertical direction" or "vertical height" as used herein denote a Z-direction of the Cartesian coordinates shown in the drawings, and the terms "horizontal," "horizontal direction," "lateral," or "lateral direction" as used herein denote an X-direction and/or a Y-direction of the Cartesian coordinates shown in the drawings.

FIG. 1 is a schematic plan view of a heterogeneous package structure with photonic components, according to an exemplary embodiment of the disclosure. More specifically, FIG. 1 schematically illustrates a package structure 100 which comprises a plurality of electronic chips 110 and 120, a plurality of photonic chips 130, 140 and 150, a plurality of optical waveguide devices 160, 161, and 162, a plurality of bridge interconnect devices 170, 171, 172, 173, 174, and 175, an optical connection device 180, and an overmold layer 190 which encapsulates the package components. It is to be understood that FIG. 1 schematically illustrates active surfaces (front side surfaces) of the electronic chips 110 and 120 and the photonic chips 130, 140 and 150.

The electronic chips 110 and 120 comprise respective metallic pillars 112 and 122 (e.g., copper pillars) formed on the respective active surfaces thereof. Further, the photonic chips 130, 140, and 150 comprise respective metallic pillars 132, 142, and 152 (e.g., copper pillars) formed on the respective active surfaces thereof. In some embodiments, the metallic pillars 112, 122, 132, 142, and 152 are utilized to enable flip-chip connections of the package structure 100 to a package substrate, and to provide power and ground connections from the package substrate to the electronic chips 110 and 120 and the photonic chips 130, 140, and 150. Further, depending on the application, in some embodiments, the metallic pillars 112 and 122 of the electronic chips 110 and 120 include metallic pillars that provide signal input/output (I/O) connections to wiring in the package substrate, which enables communication between the electronic chips 110 and 120 and communication with other components which may be mounted on, or otherwise coupled to the package substrate. Furthermore, in some embodiments, the metallic pillars 112, 122, 132, 142, and 152 include metallic pillars that are used to apply control signals to the electronic chips 110 and 120 and the photonic chips 130, 140, and 150 to implement the respective functions of such chips.

For heterogeneous packaging and integration, the electronic chips 110 and 120 may comprise any type of integrated circuitry to implement a given system for a given application. For example, the electronic chips 110 and 120 may each comprise any one of a hardware accelerator device, a multi-core processor device, a central processing unit (CPU), a microcontroller, an application-specific integrated circuit (ASIC), a field programmable gate array (FPGA), and other types of general purposes processors or work-load optimized processors such as graphics processing units (GPUs), digital signal processors (DSPs), system-onchip (SoC), and other types of specialized processors or coprocessors that are configured to execute one or more fixed functions. While the exemplary embodiment of FIG. 1 illustrates two electronic chips, it is to be understood that the package structure 100 may include any number of electronic chips (and any number of photonic chips). In addition, the package structure 100 may include other types of integrated circuit devices such as memory devices, e.g., high-bandwidth memory (HBM) dynamic random-access memory (DRAM) devices, or other devices such as power regulators or other types of passive components such as capacitors (e.g., decoupling capacitors).

Moreover, for heterogeneous packaging and integration, the photonic chips 130, 140, and 150 may comprise any type of photonic circuitry and photonic components (e.g., passive and active components) to implement a given system for a given application. For example, as schematically illustrated in FIG. 1, the photonic chips 130, 140, and 150 comprise respective photonic devices 134, 144, and 154. In some embodiments, the photonic devices 134, 144, and 154 comprise optoelectronic (OE) devices such as photodiodes, light-emitting diodes (LEDs), laser diodes, etc., which are utilized to implement an electro-optical interface between the electronic chips 110 and 120 and an optical bus implemented by the photonic chips 130, 140, and 150 and the optical waveguide devices 160, 161, and 162. In some embodiments, the photonic chips 130, 140, and 150 comprise embedded laser sources. As is known in the art, a photodiode comprises a semiconductor p-n junction which is configured to generate an electrical signal (e.g., voltage or current) when the junction is exposed to light. An LED converts an electrical signal (e.g., current) into a light signal. A laser diode is a device that converts an electrical signal to a light signal, similar to an LED, but is configured to generate a monochromatic, coherent and directional light beam signal in response to an electric signal.

Further, depending on the application, the photonic chips 130, 140, and 150 may comprise special purpose optical signal processing circuitry including, but not limited to, semiconductor optical amplifier (SOA) circuitry, electro-optic (EO) modulator circuitry, wavelength-division multiplexing (WDM) circuitry, add/drop optical filters, etc., for processing optical signals. As is known in the art, SOA circuitry comprises amplifier circuitry that is configured to amplify optical signals directly, without having to convert the optical signals to electrical signals. The WDM circuitry comprises multiplexer circuitry that configured to multiplex a plurality of optical carrier signals into one end of single optical waveguide (e.g., integrated silicon optical waveguide) using different wavelengths of laser light, and demultiplexer circuitry that is configured to demultiplex the optical signals at the other end of the single optical waveguide to separate the optical signals in different channels. The WDM circuitry can be configured to enable bidirectional optical communication of a single optical waveguide, or define optical bus allocation with wavelength assignment between the photonic dies. Further, an EO modulator is a device that is configured to modulate the power, phase, or polarization of an optical signal (e.g., laser beam) with an electrical control signal. For example, an EO phase modulator is a device which is configured to change a phase delay of an optical signal that propagates through the EO phase modulator device by the application of a control voltage. Further, add/drop optical filters can be utilized to add or remove narrow wavelengths of light from a broader optical signal being transmitted on a given waveguide.

The photonic chips 130, 140, and 150 may comprise one or more of various types of semiconductor substrate materials including, but not limited to, silicon (Si) substrates, silicon-on-insulator (SOI) substrates, lithium niobate (LiNb) substrates, compound III-V semiconductor substrates (e.g., gallium arsenide (GaAs), indium phosphide (InP), etc.), or other suitable substrates which are suitable for implementing the passive and active photonic components and optical circuitry. For example, a laser diode device can be fabricated as a stacked semiconductor structure comprising compound III-V semiconductor layers (providing the gain layers of a layer) over a silicon layer of an SOI substrate, wherein the light emitted by the laser diode is coupled to an integrated light guiding structure (e.g., an integrated silicon waveguide) which is formed in an active silicon layer of the SOI substrate below the compound III-V layers. Further, an optical modulator can be formed by P and N doping of the active silicon layer of the SOI substrate.

The photonic chips 130, 140, and 150 further comprise passive photonic components including, but not limited to, integrated optical waveguides, resonant rings, vertical grating reflectors, Bragg reflectors, etc. For example, in some embodiments, the integrated optical waveguides comprise semiconductor optical waveguides (e.g., single-mode optical waveguide structures) which are configured to transmit only a single mode of light (e.g., transverse mode) and which can transmit multiple optical signals with different frequencies/wavelengths but with the same mode. The coupling of light between a semiconductor optical waveguide and a photonic component such as a laser diode, a modulator, a photodiode, etc., can be achieved using known techniques such as through adiabatic coupling or through a vertical grating coupler.

As is known in the art, semiconductor optical waveguides comprise semiconductor waveguide cores with, e.g., rectangular-shaped cross-sections, and cladding layers that surround or otherwise encapsulate the waveguide cores. The basic design of a semiconductor optical waveguide (e.g., single-mode waveguide) is to have a waveguide core that is formed of a material with a high refractive index and a surrounding cladding layer that is formed with a material having a lower refractive index to confine an optical mode to be guided with the semiconductor optical waveguide. The types of semiconductor materials that are used to form the semiconductor optical waveguide cores and the types of materials used to form the cladding layers will vary depending on the application.

For example, in some embodiments, semiconductor optical waveguides can be fabricated to have waveguide cores formed of silicon or silicon nitride, and cladding layers formed of insulating materials such as silicon oxide. In some embodiments, the semiconductor optical waveguide cores can be patterned from a semiconductor layer of a semiconductor-on-insulator substrate, and the cladding layers can be formed by depositing and patterning a cladding material to form the cladding layers on the sides and upper surfaces of the patterned optical waveguide cores. In some embodiments, the optical waveguide cores can be formed by doping surface regions of a semiconductor substrate (e.g., doping surface regions of a LiNb substrate), wherein the doped regions form the semiconductor optical waveguides. In other embodiments, the integrated optical waveguides of the photonic chips 130, 140, and 150 may comprise polymer waveguides that are formed using known techniques, which generally include spin-coating a polymer layer onto a substrate, patterning the polymer layer (via lithography or direct laser writing) to form a desired optical waveguide/circuit pattern, and then spin-coating another polymer layer on top for planarization.

The integrated optical waveguides of the photonic chips 130, 140, and 150 are configured to transmit/route optical signals (i) to and from the photonic components and circuitry on the photonic chips 130, 140, and 150 and (ii) to and from the optical waveguide devices 160, 161, and 162 which provide optical connections between the photonic chips 130, 140, and 150. As schematically shown in FIG. 1, the optical waveguide device 160 provides an optical connection between the optical connection device 180 and the photonic chip 130. The optical waveguide device 161 provides an optical connection between the photonic chips 130 and 140. The optical waveguide device 162 provides an optical connection between the photonic chips 140 and 150.

In some embodiments, the optical waveguide devices 160, 161, and 162 comprise flexible polymer waveguide ribbons comprising polymer optical waveguides. In other embodiments, one or more of the optical waveguide devices 160, 161, and 162 comprise optical waveguide bridge interconnect devices comprising semiconductor optical waveguides or polymer optical waveguides formed on a substrate, e.g., silicon substrate, glass substrate, etc. The optical waveguide devices 160, 161, and 162 are connected to respective "coupling regions" of the photonic chips 130, 140, and 150, wherein the coupling regions of the photonic chips 130, 140, and 150 are configured to optically couple end portions of the optical waveguide devices 160, 161, and 162 to integrated optical waveguides (e.g., silicon waveguides) of the photonic chips 130, 140, and 150 using known techniques such as adiabatic coupling.

For example, one end of a polymer waveguide on a ribbon can be coupled to a given photonic chip by removing a portion of a cladding layer on the end portion of the polymer waveguide ribbon to expose a length of inner core layers, and then connecting the exposed portions of the inner core layers to cladding layers of integrated optical waveguides in the coupling region of the given photonic chip (in alignment with the polymer waveguides) to thereby enable adiabatic coupling of light between the polymer waveguide and the semiconductor optical waveguides of the photonic chips 130, 140, and 150.

In some embodiments, the optical connection device 180 comprises an optical interface to connect a standard external optical fiber ribbon (with single mode fibers) to the package structure 100, which allows the package structure 100 to be optically connected to an external system which (i) transmits optical signals to the package structure 100 and which (ii) receives optical signals transmitted from the package structure 100, via the external optical fiber ribbon. In some embodiments, the optical connection device 180 comprises a standard multi-fiber termination (MT) fiber interface connector, which is configured to interface with a flexible polymer waveguide ribbon. In some embodiments, the optical connection device 180 comprises a MT optical ferrule, an exemplary embodiment of which will be explained in further detail below with reference to FIGS. 7A and 7B. In other embodiments, the optical connection device 180 comprises a custom-made ferrule that is configured to connect to the optical waveguide device 160 and interface with external optical fibers.

In some embodiment, the bridge interconnect devices 170, 171, 172, 173, 174, and 175 are utilized to route electrical signals between the electronic chips 110 and 120 and the photonic chips 130, 140, and 150. In particular, as schematically shown in FIG. 1, the electronic chip 110 is electrically connected to the photonic chips 130, 140, and 150 via the respective bridge interconnect devices 170, 171, and 172, and the electronic chip 120 is electrically connected to the photonic chips 130, 140, and 150 via the respective bridge interconnect devices 173, 174, and 175. In some embodiments, the bridge interconnect devices 170, 171, 172, 173, 174, and 175 comprise high density chip-to-chip interconnect wiring structures to provide high-bandwidth I/O communication between the electronic and photonic chips. The bridge interconnect devices 170, 171, 172, 173, 174, and 175 are electrically connected to the front side surfaces of the respective electronic and photonic chips using solder bump interconnects. In other embodiments, electrical connections between the respective electronic and photonic chips can be implemented using wiring of a redistribution layer (RDL) structure that formed on a bottom side of the package structure, an exemplary embodiment of which will be explained in further detail in conjunction with FIG. 5.

The bridge interconnect devices 170, 171, 172, 173, 174, and 175 are fabricated using known techniques. For example, the bridge interconnect devices 170, 171, 172, 173, 174, and 175 can be fabricated using back-end-of-line (BEOL) fabrication methods in which typical BEOL dielectric and metallic materials are utilized to construct an interconnect structure (on a substrate) which comprises multiple layers of wiring and inter-layer vias that are fabricated according to target line-width and line-spacing design rules that are suitable for the given application. For example, in some embodiments, the fine-pitch wiring of the bridge interconnect devices 170, 171, 172, 173, 174, and 175 can be formed with sub-micron line-width and line-spacing design rules. In some embodiments, the bridge interconnect devices 170, 171, 172, 173, 174, and 175 are flip-chip mounted to the electronic chips 110 and 120 and photonic chips 130, 140, and 150 using C4 solder bumps or micro bumps with having relatively small bump pitches of, e.g., 75 microns or smaller or more preferably, 55 microns or less.

In the exemplary configuration shown in FIG. 1, the photonic chips 130, 140, and 150 (with the integrated optical waveguides) and the optical waveguide devices 160, 161, and 162 form a chain of optical connections extending from the optical connection device 180 to the photonic chip 150, thereby forming an integrated optical bus within the package structure 100. The optical connection device 180 extends the integrated optical bus to an external photonic source through the connection of an external optical fiber ribbon to the optical connection device 180. Furthermore, the implementation of photonic components such as laser diodes and photodiodes, etc., on the photonic chips 130, 140, and 150 provides an electro-optical interface which allows the photonic chips 130, 140, and 150 to (i) convert optical signals to electrical signals that are routed to the electronic chips 110 and 120 via the bridge interconnect devices 170, 171, 172, 173, 174, and 175, and (ii) convert electrical signals, which are received from the electronic chips 110 and 120 via the bridge interconnect devices 170, 171, 172, 173, 174, and 175, into optical signals that processed by photonic circuitry and transmitted on the integrated optical bus.

In this regard, the photonic chips 130, 140, and 150 comprise a plurality of photonic chiplets that are interconnected and work in conjunction to provide an electro-optical interface to a photonic transceiver system (optical transmitter and receiver) and integrated optical bus, which are shared by a plurality of electronic chips (e.g., electronic chips 110 and 120). The exemplary package structure 100 of FIG. 1 allows multiple electronic chips to be interconnected to the photonic chips with high bandwidth and short electrical connections (via the bridge interconnect devices 170, 171, 172, 173, 174, and 175) to a shared optical bus and an electro-optical bus interface that is implemented, collectively, by the photonic chips 130, 140, and 150 and the optical waveguide devices 160, 161, and 162 which optically connect the photonic chips 130, 140, and 150.

The exemplary package structure 100 provides an extremely high bandwidth optical communication system for transferring data to and from the electronic chips 110 and 120 in the package structure 100 using a shared high-bandwidth optical bus and electro-optical interface to (i) convert optical signals on the optical bus to electrical signals that are applied to the electronic chips and to (ii) convert electrical signals from the electronic chips into optical signals that are applied to the photonic chips. For example, in an exemplary non-limiting embodiment, each optical waveguide device 160, 161, and 162 comprises, e.g., sixteen (16) optical waveguides, wherein each of the 16 optical waveguides can carry four (4) different wavelengths of optical signals, and wherein each wavelength can carry 100 gigabits of data. In this regard, the optical bus that is collectively implemented by the optical waveguide devices 160, 161, and 162, and the integrated waveguide devices of the photonic chips 130, 140 and 150 (which are "optically stitched" together via the optical waveguide devices 160, 161, and 162) can provide an extremely high-bandwidth and low-power optical communication bus for carrying transmit (TX) and receive (RX) optical signals within the package structure. In some embodiments, the photonic chips 130, 140 and 150 can be configured for processing different ranges of wavelengths of light, wherein add/drop filters are utilized to couple the optical signals of different wavelength of light from the optical bus to the respective photonic chips, depending on the given range of light wavelengths that are handled by the respective photonic chips.

FIG. 2 is a schematic cross-sectional side view of a heterogeneous package structure with photonic components, according to another exemplary embodiment of the disclosure. In particular, FIG. 2 schematically illustrates a package structure 200 which comprises a plurality of photonic chips 230, 240, and 250 with respective metallic pillars 234, 244, and 254 disposed on active surfaces thereof, a plurality of optical waveguide devices 260, 261, and 262 (e.g., flexible polymer waveguide ribbons), an optical connection device 280 (e.g., embedded MT optical connector device), an overmold layer 290, and coolant piping 295. The exemplary package structure 200 of FIG. 2 is similar to the exemplary package structure 100 of FIG. 1, but for ease of illustration, FIG. 2 depicts the photonic components forming an optical bus that is shared by a plurality of electronic chips which are electrically connected to the photonic chips 230, 240, and 250 via the bridge interconnect devices (or alternatively, via an RDL structure). As schematically illustrated in FIG. 2, the photonic chips 230, 240, and 250 are "stitched" together and connected to the embedded optical connection device 280 using the optical waveguide devices 260, 261, and 262 (e.g., flexible ribbons of polymer waveguides), which collectively provide an embedded optical bus and render the package structure 200 as an "optically-enabled package structure" to which an external optical fiber cable can be connected.

FIG. 2 schematically illustrates that the metallic pillars 234, 244, and 254 formed on the active surfaces of the respective photonic chips 230, 240, and 250 have a vertical height (in Z direction) which is greater than (i) a thickness of the optical waveguide devices 260, 261, and 262 that are optically coupled to coupling regions on the active surfaces of the respective photonic chips 230, 240, and 250, and (ii) a thickness of the bridge interconnect devices connecting the photonic chips 230, 240, and 250 to electronic chips. For example, in an exemplary non-limiting embodiment, the metallic pillars 234, 244, and 254 can have a vertical height of, e.g., 30 microns, while the optical waveguide devices 260, 261, and 262 have a thickness of, e.g., 20 microns. Similarly, the metallic pillars formed on the active surfaces of the electronic chips have a vertical height which is greater than the thickness of the optical waveguide devices 260, 261, and 262 and the bridge interconnect devices.

As schematically illustrated in FIG. 2, the overmold layer 290 (e.g., layer of thermoset epoxy material) encapsulates the various components of the package structure 200 while exposing ends of the metallic pillars 234, 244, and 254, and exposing the backside surfaces of the photonic chips 230, 240, and 250 as well as the backside surfaces of electronic chips of the package structure 200 to enable cooling of the package structure 200. For example, a heat sink or heat spreader may be thermally coupled to the backside surfaces of the photonic chips and electronic chips of the package structure 200 for cooling the package structure 200. Further, the coolant piping 295 can be encapsulated or otherwise formed in the overmold layer 290 to allow a liquid coolant to flow through the package structure 200 for cooling. As explained in further detail below, the exposed ends of the metallic pillars 234, 244, and 254 can be connected to a first level package substrate using solder bumps (e.g., C4 bumps) or coupled to contacts/writing of an RDL structure that is subsequently formed on the package structure 200 to provide, e.g., a fan-out RDL structure.

FIG. 3 is a schematic cross-sectional side view of a heterogeneous package structure with photonic components, according to another exemplary embodiment of the disclosure. In particular, FIG. 3 schematically illustrates a package structure 300 which is similar to the package structure 200 of FIG. 3, except that the package structure 300 comprises a custom optical connection device 310 which is configured to couple an end portion of the optical waveguide device 260 (e.g., flexible polymer waveguide ribbon) to an optical fiber ribbon pigtail 320. As schematically shown in FIG. 3, one end of the optical fiber ribbon pigtail 320 is encapsulated in the overmold layer 290, while the other end is exposed outside of the package structure 300. This allows the exposed end of the optical fiber ribbon pigtail 320 to be optically connected to an external optical connector and external optical fiber ribbon or cable subsequent to fabrication of the package structure 300. In other words, the package structure 300 is fabricated with an optical fiber ribbon pigtail 320 to provide an optically-enabled package structure, where the optical fiber ribbon pigtail 320 is connected to an external optical connector subsequent to fabrication of the package structure. In some embodiments, the custom optical connection device 310 can be implemented using a custom optical ferrule which is similar in structure to, e.g., a standard MT optical connector, but with a different form factor.

Figure 4:
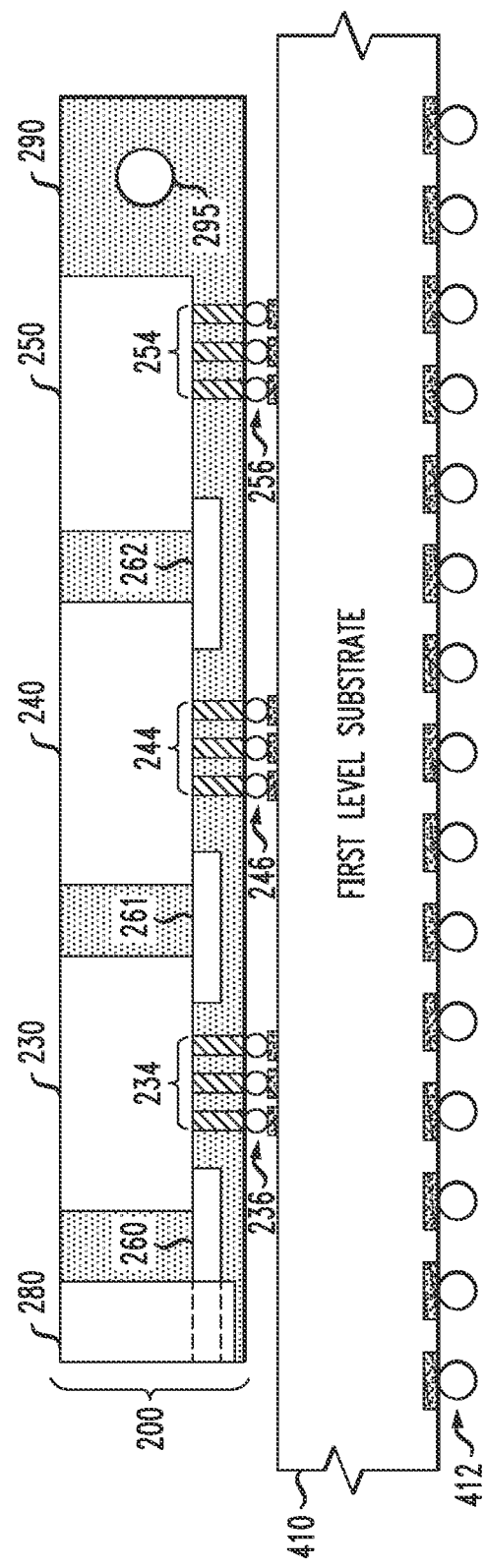
FIG. 4 is a schematic cross-sectional side view of a heterogeneous package structure with photonic components, which is flip-chip mounted on a first level substrate, according to another exemplary embodiment of the disclosure.

FIG. 4 is a schematic cross-sectional side view of a heterogeneous package structure with photonic components, according to another exemplary embodiment of the disclosure. In particular, FIG. 4 schematically illustrates a package structure 400 which comprises the exemplary package structure 200 of FIG. 2 mounted to a first level package substrate 410. As shown in FIG. 4, the arrays of metallic pillars 234, 244, and 254 have respective arrays of solder bumps 236, 246, and 256 (e.g., C4 solder bumps) formed on the exposed ends of the metallic pillars, wherein the solder bumps 236, 246, and 256 are used to electrically and mechanically bond the package structure 200 to the first level package substrate 410. In some embodiments, an underfill material is disposed between the bottom surface of the package structure 200 and an upper surface of the first level package substrate 410, which comprises an electrically-insulating adhesive material which is utilized to maintain the structural integrity of the C4 solder bumps 236, 246, and 256.

In some embodiments, the first level package substrate 410 comprises a ceramic substrate, a silicon interposer, a high-density organic laminate build-up substrate (with a redistribution fan-out layer), or any other types of package substrate technology that is suitable for the given application. In some embodiments, the first level package substrate 410 comprises an area array of solder ball interconnects 412 (e.g., BGA solder interconnects) to mount the first level package substrate 410 to another package substrate (e.g., a printed circuit board), as desired, for a given application.

In some embodiments, the first level package substrate 410 is configured to route power and ground connections to the photonic chips and the electronic chips of the package structure 200. Further, in some embodiments, the first level package substrate 410 is configured to route control signals to the photonic chips and electronic chips of the package structure 200. In some embodiments, the first level package substrate 410 can be configured to provide lateral electrical connections between a photonic chip and an electronic chip of the package structure 200, in place of, or in addition to, bridge interconnect devices. In some embodiments, the first level package substrate 410 can include wiring to provide signal communication between electronic chips of the package structure 200 and other components that may be mounted to, or otherwise connected to, the first level package substrate 410 of the package structure 400.

Figure 5:
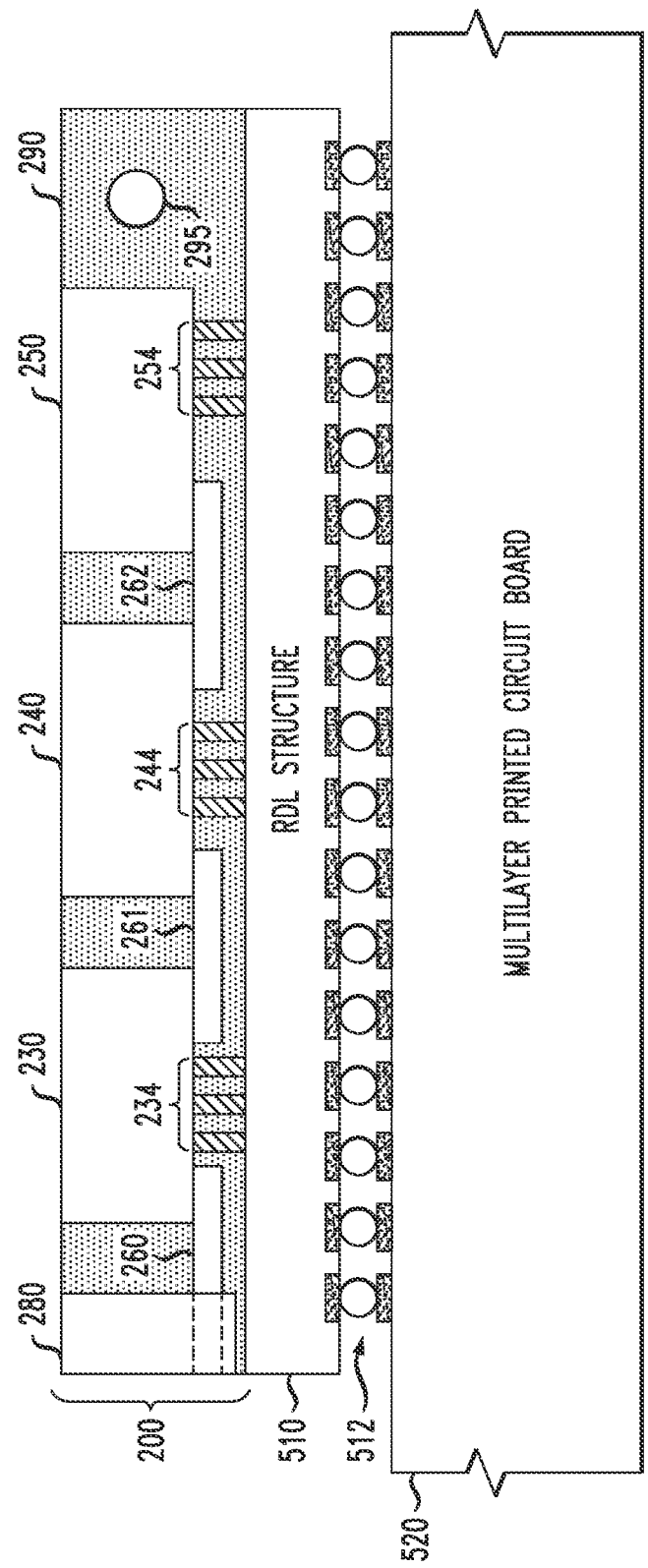
FIG. 5 is a schematic cross-sectional side view of a heterogeneous package structure with photonic components, which comprises a redistribution layer configured to interconnect dies of the package structure, according to another exemplary embodiment of the disclosure.

FIG. 5 is a schematic cross-sectional side view of a heterogeneous package structure with photonic components, according to another exemplary embodiment of the disclosure. In particular, FIG. 5 schematically illustrates a package structure 500 which comprises the exemplary package structure 200 of FIG. 2, an RDL structure 510, and a multilayer printed circuit board 520. In some embodiments, the RDL structure 510 comprises an organic build-up interposer which is fabricated using known thin film technologies to build one or more organic redistribution layers directly on the bottom surface of the package structure 200. With this configuration, the RDL structure 510 comprises metallization that is formed in direct contact with the exposed ends of the metallic pillars 234, 244, and 254 without the need for solder bumps. In some embodiments, RDL structure 510 can be designed with lateral wiring to provide electrical connections between the electronic and photonic chips in addition to, or in place of, bridge interconnect devices (e.g., bridge interconnect devices 170-175 as shown in FIG. 1). The RDL structure 510 provides a platform for power/ground fan-out connections and I/O redistribution and fan-out, as needed, for a given application. The RDL structure 510 can be mounted to the multilayer printed circuit board 520 using an array of solder bumps 512 (e.g., C4 solder bumps) with contact pitches of 100 microns or greater.

Figure 6:
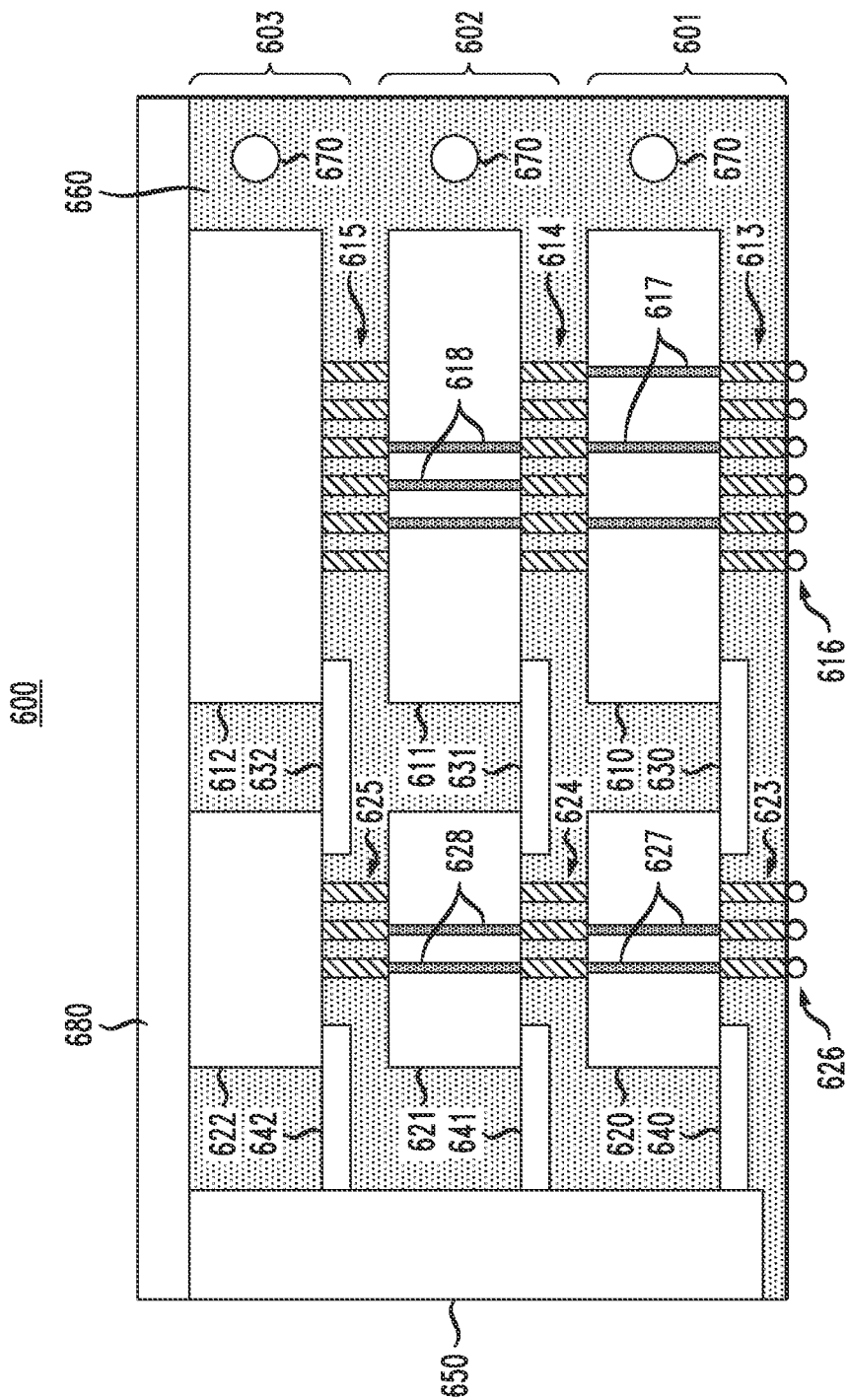
FIG. 6 is a schematic cross-sectional side view of a three-dimensional heterogeneous package structure with photonic components, according to another exemplary embodiment of the disclosure.

FIG. 6 is a schematic cross-sectional side view of a heterogeneous package structure with photonic components, according to another exemplary embodiment of the disclosure. In particular, FIG. 6 schematically illustrates a three-dimensional (3D) package structure 600 comprising multiple package levels 601, 602, and 603 of photonic chips and electronic chips, which are vertically stacked on top of each other, and interconnected (without an intermediate layer or package substrate) using vertical interconnection structures such as through silicon via (TSV) interconnect structures. A first package level 601 comprises an electronic chip 610, a photonic chip 620, a bridge interconnect device 630, and an optical waveguide device 640. A second package level 602 comprises an electronic chip 611, a photonic chip 621, a bridge interconnect device 631, and an optical waveguide device 641. A third package level 603 comprises an electronic chip 612, a photonic chip 622, a bridge interconnect device 632, and an optical waveguide device 642. Similar to the exemplary embodiments discussed above, the bridge interconnect devices 630, 631, and 632 provide electrical connections between the respective electronic chips and photonic chips, as schematically shown.

The optical waveguide devices 640, 641, and 642 (e.g., flexible polymer waveguide ribbons) optically couple the photonic chips 620, 621, and 622, to an optical connection device 650, which in some embodiments, is configured to optically commonly couple the ends of the optical waveguide devices 640, 641, and 642 to an external optical fiber ribbon or cable, thereby providing optical buses inside the 3D package structure. In some embodiments, the optical connection device 650 comprises a custom designed optical ferrule device for optically coupling the optical waveguide devices 640, 641, and 642 in the 3D package structure 600.

The 3D package structure 600 further comprises an overmold layer 660 which encapsulates the various package components including coolant piping 670, which is embedded or otherwise formed in the overmold layer 660. The 3D package structure 600 further comprises a heat spreader or heat sink device 680 thermally coupled (via thermal interface material) to an upper surface of the 3D package structure 600. Furthermore, to enable the 3D chip stacking configuration, in some embodiments, the 3D package structure 600 utilizes through-silicon via (TSV) technology, wherein the bottom most chip and intermediate chips in the 3D packaging comprise TSV structures to enable delivery of ground and power connections from the package substrate to each of the stacked chips, as well as possible I/O communication between the electronic chips and to the package substrate.

For example, as schematically shown in FIG. 6, the electronic chips 610, 611, and 612 comprise respective arrays of metallic pillars 613, 614, and 615 disposed on the active surfaces thereof. Similarly, the photonic chips 620, 621, and 622 comprise respective arrays of metallic pillars 623, 624, and 625 disposed on the active surfaces thereof. The metallic pillars 613 of the first level electronic chip 610 have solder bumps 616 disposed on the exposed ends of the metallic pillars 613 for connection to a package substrate. On the other hand, the metallic pillars 614 of the second level electronic chip 611 are coupled to the metallic pillars 613 through TSV structures 617 of the first level electronic chip 610. Similarly, the metallic pillars 615 of the third level electronic chip 612 are coupled to the metallic pillars 614 through TSV structures 618 of the second level electronic chip 611. For the stack of photonic chips 620, 621, and 622, the metallic pillars 623 of the first level photonic chip 620 have solder bumps 626 disposed on the exposed ends of the metallic pillars 623 for connection to the package substrate. On the other hand, the metallic pillars 624 of the second level photonic chip 621 are coupled to the metallic pillars 623 through TSV structures 627 of the first level photonic chip 620, and the metallic pillars 625 of the third level photonic chip 622 are coupled to the metallic pillars 624 through TSV structures 628 of the second level photonic chip 621.

It is to be understood that while the exemplary 3D package structure 600 of FIG. 6 is shown to have three stacked chip levels, in other embodiments, the 3D package structure 600 may have two stacked chip levels or more than three stacked chip levels. Furthermore, while each stacked chip level in FIG. 6 is shown to have one photonic chip and one electronic chip, each stacked chip level may have two or more photonic chips and two or more electronic chips. For example, in some embodiments, a 3D package structure can be constructed to have two or more levels of the exemplary package layout structure shown in FIG. 1.

Figure 7B:
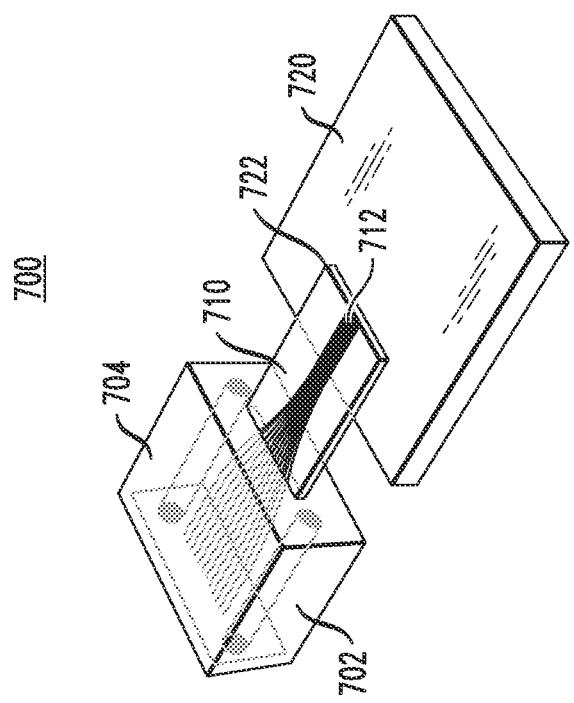
FIGS. 7A and 7B schematically illustrate an optical connection system for coupling a polymer waveguide device to an optical connector and a photonic chip, according to an exemplary embodiment of the disclosure.
Figure 7A:
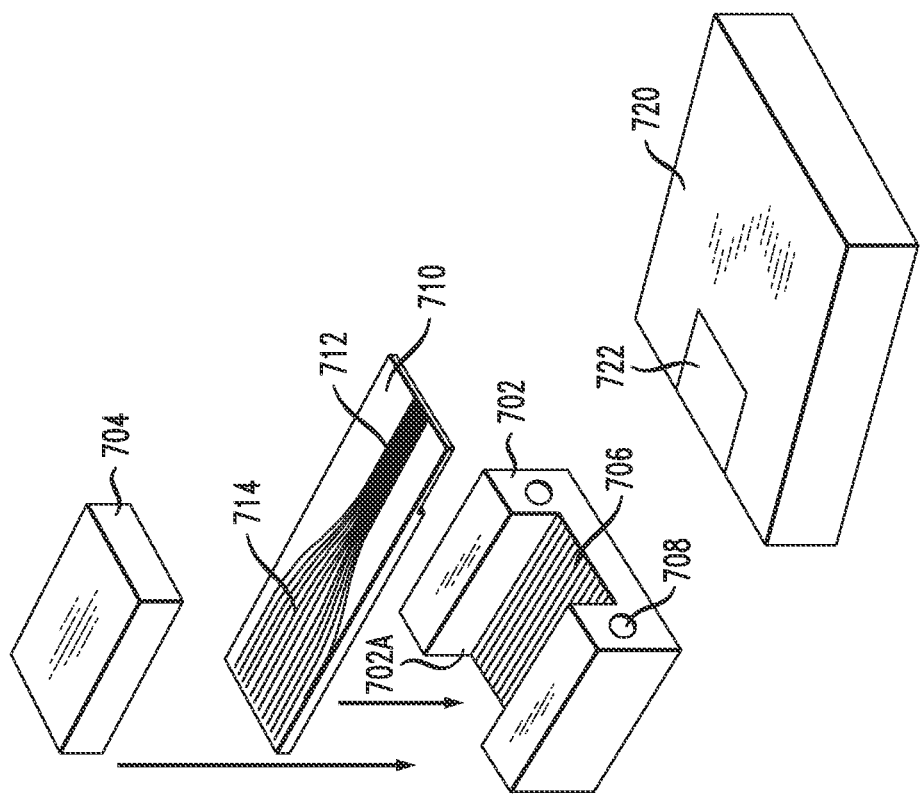

FIGS. 7A and 7B schematically illustrate an optical connection system 700 for coupling a polymer waveguide device to an optical connector and a photonic chip, according to an exemplary embodiment of the disclosure. FIG. 7A is an exploded view of the components of the optical connection system 700 while FIG. 7B is a schematic perspective view of the optical connection system 700 in assembled form. The optical connection system 700 comprises an optical connector 702 and connector lid 704, which collectively implement an optical ferrule which provides a standard MT interface for connection to an optical fiber ribbon. The optical connector 702 comprises a recessed region 702A which is configured to receive one end of a polymer waveguide ribbon 710.

In particular, the polymer waveguide ribbon 710 comprises a plurality of polymer waveguides which are closely spaced on a first end portion 712 of the polymer waveguide ribbon 710, and which fan out to a wider spacing on a second end portion 714 of the polymer waveguide ribbon 710 (to comply with the optical fiber spacing for standard MT fiber interface (e.g., 250 μm fiber pitch)). The first end portion 712 of the polymer waveguide ribbon 710 is optically connected (via an optical UV curable adhesive) to a coupling region 722 of photonic chip 720, while the second end portion 714 of the polymer waveguide ribbon 710 is fixedly disposed in the recessed region 702A of the optical connector by, e.g., the connector lid 704. A bottom surface of the recessed region 702A comprises mechanical alignment structures 706 to properly position the second end portion 714 of the polymer waveguide ribbon 710 in the recessed region 702A of the optical connector 702. The optical connector 702 comprises alignment holes 708 to enable insertion of alignment pins for connecting a fiber optical cable/ribbon to the optical connector 702.

FIG. 7B illustrates an exemplary embodiment of an optical connection system which can be utilized in, e.g., the package structure 100 of FIG. 1 for connecting the optical waveguide device 160 to the optical connection device 180 and the photonic chip 130. In such embodiment, the optical waveguide device 160 can be the flexible polymer waveguide ribbon 710 of FIGS. 7A and 7B, and the optical connection device 180 can implement the optical connector 702 (e.g., MT ferrule) and associated connector lid 704.

FIG. 8 illustrates a flow diagram of a process 800 for fabricating a heterogeneous package structure with photonic components, according to an exemplary embodiment of the disclosure. For purposes of illustration, fabrication process of FIG. 8 may be discussed in the context of the exemplary package structure 100 of FIG. 1, although it is to be understood that the same or similar process flows are utilized to construct other exemplary package structures as discussed herein. An initial phase of the fabrication process 800 comprises placing a plurality of photonic chips and electronic chips and other components on a carrier substrate (block 801). For example, to construct the package structure 100 of FIG. 1, the electronic chips 110 and 120 and photonic chips 130, 140, and 150 would be placed face up with backside surfaces bonded to the carrier substrate. The placement of the photonic chips and the electronic chips can be performed using a high precision pick-and-place tool. In addition, at least a portion of the optical connection device 180 would be placed on the carrier substrate in alignment with the photonic chip 130. For wafer-level processing, multiple instances of a given package structure (e.g., package structure 100, FIG. 1) can be fabricated on the same carrier wafer, and subsequently diced to separate the package structure.

A next step in the fabrication process may include attaching optical waveguide devices to the photonic chips and the optical interface device (block 802). For example, in some embodiments, this process comprises attaching flexible polymer waveguide ribbons to the coupling regions on the active surfaces of the photonic chips (using a suitable optical glue) to form optical connections between the photonic chips and to form an optical connection between the optical interface device and at least one photonic chip (e.g., FIGS. 7A and 7B). With this process, it is assumed that the metallic pillars on the active surfaces of the photonic chips and electronic chips are already formed as part of the chip fabrication process. A next step in the fabrication process may include attaching the electrical bridge interconnect devices to bridge bonding regions on the active surfaces of the photonic and electronic chips (block 803). The placement of the electrical bridge interconnect devices to the bonding sites of the photonic and electronic chips can be performed using a high precision pick-and-place tool. In some embodiments, the bridge interconnect devices are bonded to the bonding sites on the active surfaces of the electronic and photonic chips using thermocompression techniques or other suitable techniques. It is to be noted that the order of the process steps of blocks 802 and 803 can vary such that the electrical bridge interconnect devices are placed and connected prior to the optical waveguide devices.

Next, a molding process is performed to encapsulate the photonic and electronic components in an overmold layer (block 804). For example, the molding process may be performed using an injection molding process to deposit any suitable thermoset epoxy material which comprises desired properties for the given package application, to form the overmold layer. The overmold layer is then planarized down to expose the ends of the metallic pillars that are formed on the active surfaces of the photonic and electronic chips (block 805). Since the metallic pillars are formed with vertical heights from the active surfaces of the photonic and electronic chips, which are greater than the thickness of the optical waveguide devices and bridge interconnect devices that are bonded to the surfaces of the photonic and electronic chips, the metallic pillars essentially serve as an etch stop to prevent over-planarizing the overmold layer and possibly exposing and damaging the optical waveguide and bridge interconnect devices.

Additional processing steps are then performed to provide connections to the exposed ends of the metallic pillars (block 806). For example, in some embodiments, solder bump connections are formed on the exposed end portions of the metallic pillars to enable bonding of the package structure to a package substrate. In other embodiments, for fan-out wafer-level processing (FOWLP), an RDL structure comprising one or more redistribution layers are formed on the bottom surface of the wafer level package to provide re-routing wiring and connections to the exposed metallic pillars on the bottom side of the wafer-level package.

A dicing process is then performed to cut the wafer-level package structure into individual package structures (block 807). The dicing process can be formed before or after removing the carrier substrate from the top side of the wafer-level package structure or the individual package structures.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A package structure, comprising:
   at least one electronic device;
   at least one photonic device laterally disposed adjacent to the at least one electronic device;
   at least one bridge interconnect device configured to electrically connect the at least one electronic device to the at least one photonic device, wherein the at least one bridge interconnect device comprises a first surface that is connected to an active surface of the at least one electronic device and to an active surface of the at least one photonic device; and
   at least one optical waveguide device that is optically coupled to the at least one photonic device to implement an optical bus for routing optical signals in the package structure, wherein the at least one photonic device is configured to implement an electro-optical interface between the at least one electronic device and the optical bus; and
   an overmold layer which encapsulates the at least one electronic device, the at least one photonic device, the at least one bridge interconnect device, and the at least one optical waveguide device, wherein the at least one bridge interconnect device has a second surface, opposite first surface thereof, which is covered by the overmold layer.

2. The package structure of claim 1, wherein the overmold layer comprises coolant piping embedded therein.

3. The package structure of claim 1, wherein the at least one optical waveguide device comprises a flexible polymer waveguide device.

4. The package structure of claim 1, wherein:
   the at least one optical waveguide device is optically coupled to a coupling region on the active surface of the at least one photonic device.

5. The package structure of claim 4, wherein the coupling region on the active surface of the at least one photonic device is configured to enable adiabatic coupling of an end portion of the at least one optical waveguide device to semiconductor optical waveguides formed on the active surface of the at least one photonic device.

6. The package structure of claim 4, wherein:
   the at least one electronic device and the at least one photonic device each comprise metallic pillars formed on the active surfaces thereof; and
   a height of at least some of the metallic pillars is greater than a thickness of the at least one bridge interconnect device and a thickness of the at least one optical waveguide device.

7. The package structure of claim 1, further comprising an optical connector which is optically coupled to the at least one photonic device by the at least one optical waveguide device, wherein the optical connector is configured for connection to external optical fibers which transmit and receive optical signals to and from the optical bus.

8. The package structure of claim 1, wherein the at least one photonic device comprises an optical transceiver system.

9. A package structure, comprising:
   at least one application specific integrated circuit device;
   at least one photonic device comprising an optical transceiver system, and laterally disposed adjacent to the at least one application specific integrated circuit device;
   at least one bridge interconnect device configured to electrically connect the at least one application specific integrated circuit device to the at least one photonic device, wherein the at least one bridge interconnect device comprises a first surface that is connected to an active surface of the at least one application specific integrated circuit device and to an active surface of the at least one photonic device;
   at least one optical waveguide device which is optically coupled to the at least one photonic device to implement an optical bus for routing optical signals in the package structure;
   an optical connection device which is optically coupled to the at least one optical waveguide device, wherein the optical connection device is configured for connection to external optical fibers which transmit and receive optical signals to and from the optical transceiver system over the optical bus; and
   an overmold layer which encapsulates the at least one application specific integrated circuit device, the at least one photonic device, the at least one bridge interconnect device, the at least one optical waveguide device, and the optical connection device, wherein the at least one bridge interconnect device has a second surface, opposite first surface thereof, which is covered by the overmold layer.

10. The package structure of claim 9, wherein the overmold layer comprises coolant piping embedded therein.

11. The package structure of claim 9, wherein the at least one optical waveguide device comprises a flexible polymer waveguide device.

12. The package structure of claim 9, wherein:
   the at least one optical waveguide device is optically coupled to a coupling region on the active surface of the at least one photonic device.

13. The package structure of claim 12, wherein the coupling region on the active surface of the at least one photonic device is configured to enable adiabatic coupling of an end portion of the at least one optical waveguide device to semiconductor optical waveguides formed on the active surface of the at least one photonic device.

14. The package structure of claim 12, wherein:
   the at least one application specific integrated circuit device and the at least one photonic device each comprise metallic pillars formed on the active surfaces thereof; and
   a height of at least some of the metallic pillars is greater than a thickness of the at least one bridge interconnect device and a thickness of the at least one optical waveguide device.

15. The package structure of claim 9, wherein the at least one photonic device is configured to implement an electro-optical interface between the at least one application specific integrated circuit device and the optical bus.

16. A package structure, comprising:
a plurality of package levels disposed in a vertically stacked configuration, wherein at least two package levels each comprise:
at least one electronic device;
at least one photonic device laterally disposed adjacent to the at least one electronic device;
at least one bridge interconnect device configured to electrically connect the at least one electronic device to the at least one photonic device, wherein the at least one bridge interconnect device comprises a first surface that is connected to an active surface of the at least one electronic device and to an active surface of the at least one photonic device; and
at least one optical waveguide device that is optically coupled to the at least one photonic device to implement an optical bus for routing optical signals in the package structure;
wherein the at least one photonic device is configured to implement an electro-optical interface between the at least one electronic device and the optical bus.

17. The package structure of claim 16, wherein the at least one optical waveguide device comprises a flexible polymer waveguide device.

18. The package structure of claim 16, wherein
the at least one optical waveguide device is optically coupled to a coupling region on the active surface of the at least one photonic device.

19. The package structure of claim 18, wherein the coupling region on the active surface of the at least one photonic device is configured to enable adiabatic coupling of an end portion of the at least one optical waveguide device to semiconductor optical waveguides formed on the active surface of the at least one photonic device.

20. The package structure of claim 18, wherein:
the at least one electronic device and the at least one photonic device each comprise metallic pillars formed on the active surfaces thereof; and
a height of at least some of the metallic pillars is greater than a thickness of the at least one bridge interconnect device and a thickness of the at least one optical waveguide device.

* * * * *